(12) United States Patent
Tran et al.

(10) Patent No.: US 6,542,492 B1
(45) Date of Patent: Apr. 1, 2003

(54) METHOD AND SYSTEM OF INITIALIZING STATE METRICS FOR TRAFFIC, PAGING, AND SYNC CHANNELS TO ENHANCE VITERBI DECODER PERFORMANCE

(75) Inventors: Howard Tran, Downey, CA (US); Jyoti Setlur, Irvine, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/322,293

(22) Filed: May 28, 1999

(51) Int. Cl.$^7$ ............................................. G21C 23/00
(52) U.S. Cl. ........................ 370/342; 370/335; 370/329; 370/350; 370/341; 455/452; 455/458; 714/795
(58) Field of Search ................................ 455/452, 458; 370/342, 335, 333, 329, 350; 375/341; 714/795

(56) References Cited

U.S. PATENT DOCUMENTS

| 5,511,067 A | * | 4/1996 | Miller ......................... 370/335 |
| 5,710,784 A | * | 1/1998 | Kindred et al. ............. 375/262 |
| 5,796,757 A | * | 8/1998 | Czaja ......................... 714/789 |
| 6,011,978 A | * | 1/2000 | Ault et al. .................. 455/454 |
| 6,192,252 B1 | * | 2/2001 | Lysejko et al. ............. 455/452 |
| 6,205,186 B1 | * | 3/2001 | Butler et al. ................ 375/341 |
| 6,345,073 B1 | * | 2/2002 | Curry et al. ................ 375/134 |
| 6,359,868 B1 | * | 3/2002 | Chen et al. ................. 370/335 |
| 2002/0010895 A1 | * | 1/2002 | Mujtaba ...................... 714/795 |

* cited by examiner

Primary Examiner—William Trost
Assistant Examiner—Marcos L Torres
(74) Attorney, Agent, or Firm—Peter Zawilski

(57) ABSTRACT

A method and system of initializing state metrics for traffic, paging, and sync channels to enhance Viterbi decoder performance. Specifically, one embodiment of the present invention includes a common circuit adapted for initializing state metric data of a traffic channel, a paging channel, and a sync channel within a Code Division Multiple Access (CDMA) system without compromising performance of any channel. The common circuit comprises a multiplexer stage coupled to receive a first signal and a second signal. Furthermore, the common circuit comprises a logic stage coupled to receive a plurality of signals. Additionally, the logic stage is also coupled to the multiplexer stage. As such, the multiplexer stage and the logic stage are adapted to initialize state metric data of any one of a traffic channel, a paging channel, and a sync channel within a Code Division Multiple Access (CDMA) system. It is appreciated that the common circuit does not compromise performance of any one of the traffic channel, the paging channel, and the sync channel.

21 Claims, 5 Drawing Sheets

METHOD AND SYSTEM OF INITIALIZING STATE METRICS FOR TRAFFIC, PAGING, AND SYNC CHANNELS TO ENHANCE VITERBI DECODER PERFORMANCE

TECHNICAL FIELD

The present invention relates to the field of communications. More particularly, the present invention relates to the field of Viterbi decoders utilized within a communication system.

BACKGROUND ART

Cellular telephony has become a widely available mode of communication in modern society. Variable rate communication systems, such as Code Division Multiple Access (CDMA) systems, are among the most commonly deployed cellular technology. Within the CDMA system, convolution encoding of data and decoding the data utilizing a Viterbi decoder are typically part of the communication process, which is well known by those of ordinary skill in the art. Furthermore, with the CDMA system there exists a traffic channel, a paging channel, and a sync channel which are all used for implementing different types of communication between a base station and a mobile station (e.g., handset). The traffic channel is utilized for transmission and reception of voice/data communication by a user. The paging channel is utilized for transmission and reception of non-user data between the base station and mobile station while the sync channel is utilized for synchronizing the base station and mobile station for communication.

As part of decoding the traffic, paging, and sync channels during communication within the CDMA system, different initialization processes of state metric data for each channel are performed depending on the type of channel being used at the time. Specifically, state metric data for both the paging channel and the sync channel are initialized using the same initialization process while state metric data of the traffic channel is initialized using a different initialization process. Typically within the prior art a circuit was specifically designed and utilized to perform the initialization process of the state metric data for the traffic channel while another circuit was specifically designed and utilized to perform the initialization process of the state metric data for both the paging channel and the sync channel. The disadvantage associated with this prior art approach is that the two circuits take up more space and add additional costs to the manufacturing process. It is appreciated that another prior approach is unable to initialize the state metric data of the traffic channel, paging channel, and the sync channel efficiently.

Accordingly, a need exists for a method and system for initializing state metric data of the traffic channel, paging channel, and sync channel within the CDMA system which does not utilize a large amount of space, does not incur higher manufacturing expenses, and also efficiently performs these initialization processes.

DISCLOSURE OF THE INVENTION

The present invention provides a method and system for initializing state metric data of the traffic channel, paging channel, and sync channel within a decoder within the Code Division Multiple Access (CDMA) system. Furthermore, the present invention efficiently performs these initialization processes by reducing the number of gates and hence power consumption. Moreover, the present invention does not utilize a large amount of space and also does not incur higher manufacturing expenses. Additionally, the present invention enhances performance by quickly synchronizing to paging and sync frames.

Specifically, one embodiment of the present invention includes a common circuit adapted for initializing state metric data of a traffic channel, a paging channel, and a sync channel within a Code Division Multiple Access (CDMA) system without compromising performance of any of these channels despite their different reset/initialization procedures during the encoding stage. The common circuit comprises a multiplexer stage coupled to receive a first signal and a second signal. Furthermore, the common circuit comprises a logic stage coupled to receive a plurality of signals. Additionally, the logic stage is also coupled to the multiplexer stage. As such, the multiplexer stage and the logic stage are adapted to initialize state metric data of any one of a traffic channel, a paging channel, and a sync channel within a Code Division Multiple Access (CDMA) system. It is appreciated that the common circuit does not compromise, but in fact, enhances performance of any one of the traffic channel, the paging channel, and the sync channel.

Another embodiment of the present invention also includes a method for initializing state metric data for a traffic channel, a paging channel, and a sync channel within a CDMA system without compromising performance of any channel. The method comprises the step of receiving previous state metric data. The method also includes the step of determining what channel the state metric data corresponds to within a CDMA system. Furthermore, the method includes the step of determining what stage the state metric data corresponds to. Additionally, the method includes the step of determining what state the state metric data corresponds to. Moreover, the method includes the step of initializing the state metric data based on the channel, the stage, and the state corresponding to the state metric data within the CDMA system without compromising performance of a traffic channel, a paging channel, and a sync channel.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Figure 1:
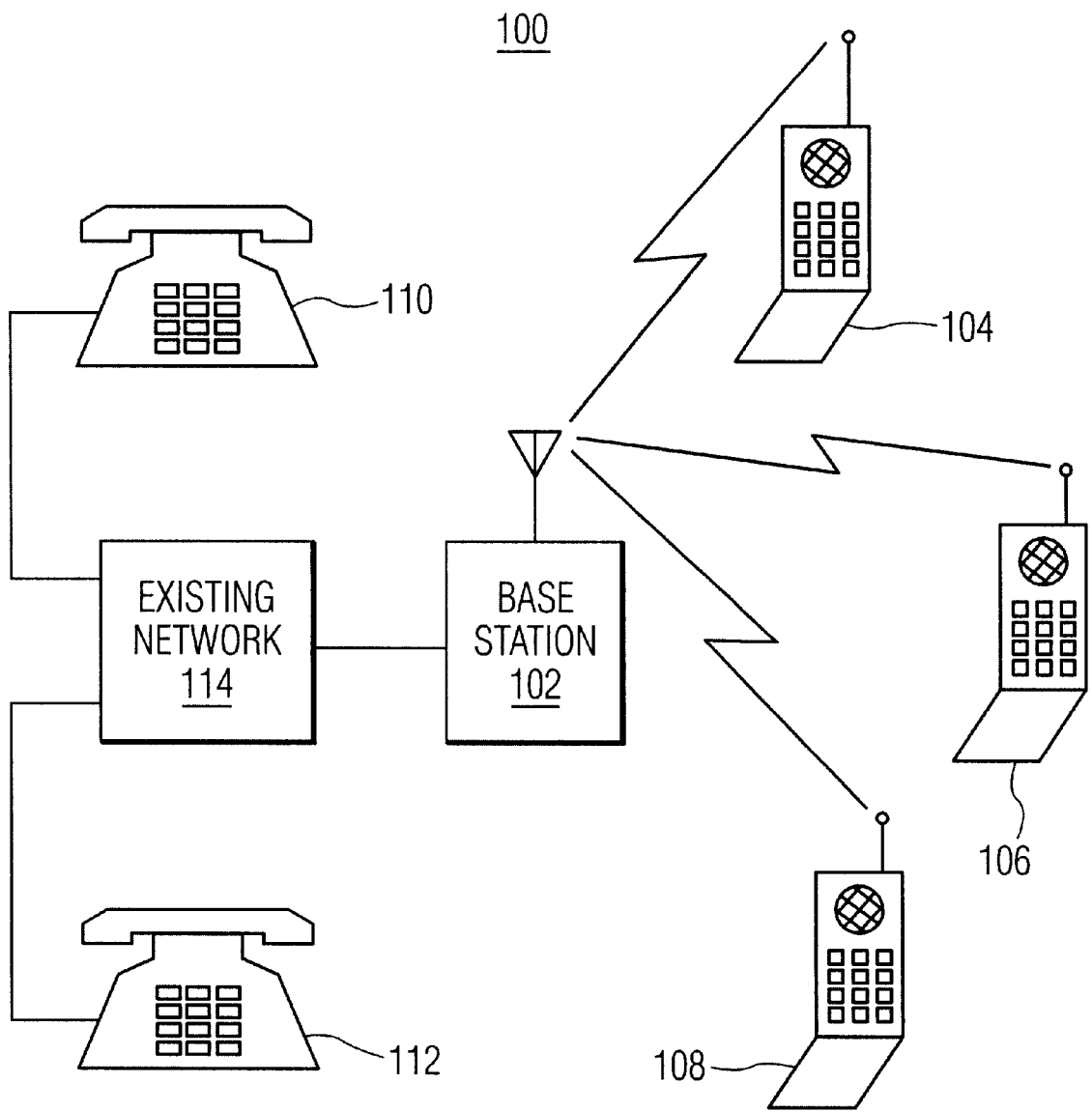
FIG. 1 illustrates a general overview of a Code Division Multiple Access (CDMA) system in accordance with one embodiment of the present invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in electronic circuitry and/or electronic computing device. It has proved convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "determining", "receiving", "initializing", "using", "transmitting" or the like, refer to the actions and processes of electronic circuitry, or electronic computing device. The electronic circuitry or electronic computing device manipulates and transforms data represented as physical (electronic) quantities within registers, memories, and other electronic circuitry into other data similarly represented as physical quantities within the memories or registers or other such information storage, or transmission.

The present invention operates within a digital communication system which utilizes convolutional encoding and Viterbi decoding for two or more channels. It should be appreciated that the present invention provides a method and system for performing at least two different initialization processes of state metric data for at least two different channels. Furthermore, the present invention can be implemented with different devices including, but not limited to, a mobile station and a base station of a communication system. For purposes of clarity, the following detailed description recites embodiments of the present invention implement ed within a Code Division Multiple Access (CDMA) system. The present invention is not limited solely to use within a CDMA system however. These examples are merely illustrative of how the present invention operates within a particular communication system.

The present invention can operate within the communication system known as the Code Division Multiple Access (CDMA) system which provides its users wireless voice communication. Along with providing its users wireless voice communication, the CDMA system also provides facsimile (fax) and multimedia communication capabilities. The CDMA system has the ability to operate both indoors and outdoors, which offers greater communication opportunities. For instance, the indoor operations include using it within office spaces, homes, hotels, shopping malls and airports. Furthermore, the outdoor operations of the CDMA system include using it within rural, suburban, and city areas. The CDMA system is well known by those skilled in the art.

FIG. 1 illustrates a general overview of a CDMA system 100 in which the present invention operates. The two main components that comprise the CDMA system are a base station device and a mobile station device. Referring to FIG. 1, mobile stations 104–108 are similar in function to cordless telephone handsets and have the ability to transmit and receive voice information along with other types of data. Base station 102 is a transmitter and receiver base station which can be implemented by coupling it into an existing network 114, such as a public telephone network. Implemented in this way, base station 102 enables the users of mobile stations 104–108 to communicate with each other and with the users of telephones 110 and 112, which are coupled by wire to the existing network 114. The information that is communicated between base station 102 and mobile stations 104–108 is the same type of information (e.g., voice/data etc.) that can normally be transferred and received over a public telephone wire network system. Instead of communicating over a wire network, the CDMA system uses a wireless digital radio interface to communicate information between base station 102 and mobile stations 104–108.

Figure 2:
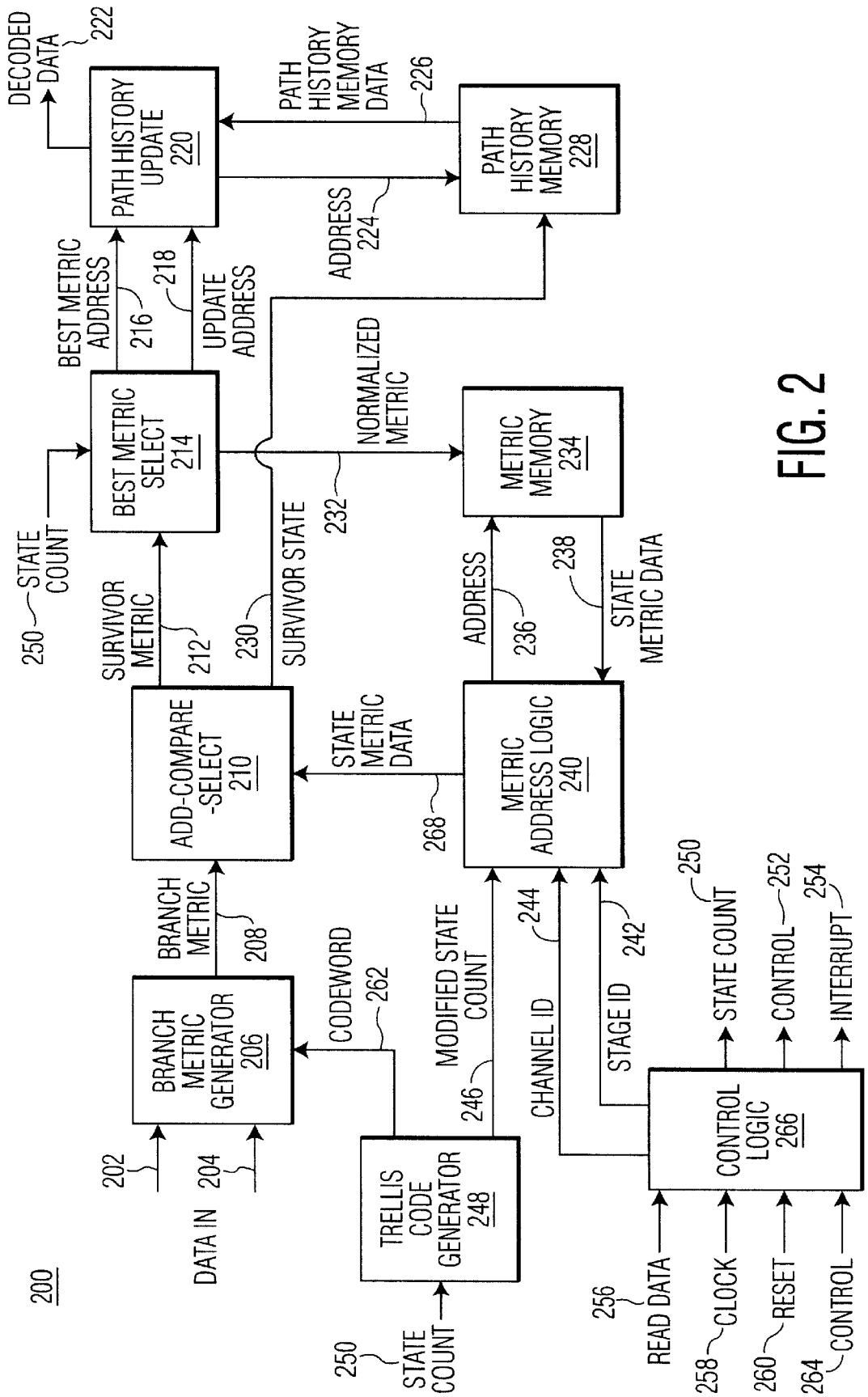
FIG. 2 is a block diagram of a Viterbi decoder circuit in accordance with one embodiment of the present invention.

With reference now to FIG. 2, which is a block diagram of a Viterbi decoder circuit 200 in accordance with one embodiment of the present invention. It should be appreciated that Viterbi decoder circuit 200 can be internally implemented within a mobile station (e.g., 104 of FIG. 1) of CDMA system 100. Viterbi decoder circuit 200 operates to decode convolutional encoded data. Specifically, two convolutional encoded symbols 202 and 204 are received by a branch metric generator circuit 206. The branch metric generator circuit 206 is coupled to an output of a trellis code generator circuit 248 in order to receive a codeword signal 262. It is appreciated that the trellis code generator circuit 248 determines what the expected codes are. The branch metric generator circuit 206 compares the convolutional encoded symbols 202 and 204 that it receives with the codeword signal 262 generated by trellis code generator circuit 248. Based on the difference between the two, a metric is generated by branch metric generator circuit 206 for each and every branch in the trellis. The branch metric generator circuit 206 then outputs a branch metric 208 which is received by an add-compare-select (ACS) circuit 210. It should be appreciated that while Viterbi decoder circuit 200 travels through a trellis for the incoming data (e.g., 202 and 204), it keeps track of metrics of the different states. Essentially, each branch metric (e.g., 208) is added to the previous metric of a state and it is stored for that stage. As such, every state has an associated state metric which is stored within a metric memory 234.

Within the present embodiment, the coding rate is one half (½), which means that for every input there are two symbols coming out of the convolutional encoder. As such, each state has two possible sources and two possible destinations. During the Add-Compare-Select (ACS) stage, the Viterbi decoder circuit 200 decides which is the most likely path by comparing the two paths coming into each state and determines which is more likely to happen. One of the ways to do this is to compare the metric for both parts and take the greater or smaller one depending on the implementation. Within the present embodiment, the add-compare-select circuit 210 compares the metrics of the two paths, chooses the smallest metric and thereby decides which one is the better path. Subsequently, a survivor metric signal 212 is sent by the add-compare-select circuit 210 to a best metric select circuit 214. It is appreciated that the best metric select circuit 214 is coupled to receive a state count signal 250 from a control logic circuit 266. The best metric select circuit 214 normalizes the survivor metric 212 and then outputs a normalized metric 232 to the metric memory 234, which stores it.

Still referring to FIG. 2, it should be appreciated that the add-compare-select circuit 210 also outputs a survivor state signal 230 which is received by a path history memory 228, which is also referred to as a traceback memory 228. The survivor state signal 230 is an indication of which of the two paths (branches) were chosen by the add-compare-select circuit 210. The path history memory 228 is the memory device which contains the decisions about which of the paths are preferred over the others.

The best metric select circuit 214 also outputs a best metric address signal 216 and an update address signal 218 which are both received by a path history update circuit 220. The path history update circuit 220 outputs an address signal 224 which is received by path history memory 228. The path history memory 228 outputs a path history memory data signal 226 which is received by path history update circuit 220. Eventually, the path history update circuit 220 outputs a decoded data signal 222.

The metric memory 234 of FIG. 2 is coupled to receive an address signal 236 output by a metric address logic circuit 240. Furthermore, the metric memory 234 is coupled to output state metric data 238 to metric address logic circuit 240. The metric address logic circuit 240 is also coupled to control logic circuit 266 in order to receive both a channel identification (ID) signal 244 and a stage identification (ID) signal 242. It should be appreciated that one embodiment of the present invention adapted for initializing state metric data of the traffic channel, paging channel, and sync channel of CDMA system 100 is located within metric address logic circuit 240, which is described in detail below.

It is appreciated that control logic circuit 266 is coupled to receive a read data signal 256, a clock signal 258, a reset signal 260, and a control signal 264. Moreover, control logic circuit 266 outputs a control signal 252, an interrupt signal 254, and state count signal 250. It should be further appreciated that control logic circuit 266 is coupled to trellis code generator circuit 248 in order to output state count signal 250 to it. The trellis code generator circuit 248 modifies the received state count signal 250 and subsequently outputs a modified state count signal 246, which is received by metric address logic circuit 240. Metric address logic circuit 240 also outputs state metric data signal 268 which is received by the add-compare-select circuit 210.

Figure 3:
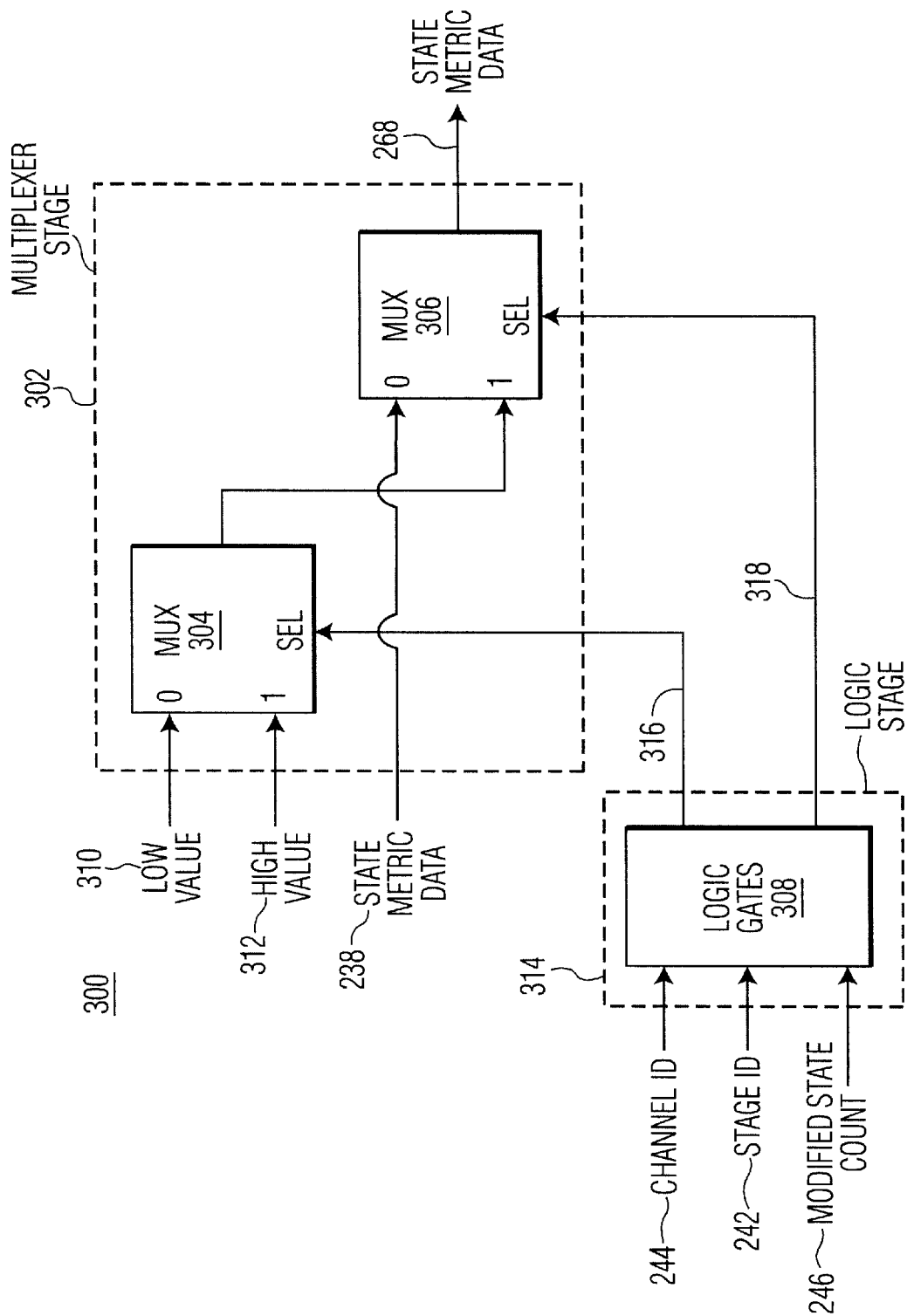
FIG. 3 is a block diagram of circuitry adapted for initializing state metric data of a traffic channel, a paging channel, and a sync channel within a CDMA system in accordance with one embodiment of the present invention.

Referring now to FIG. 3, which is a block diagram of circuit 300 adapted for initializing state metric data 238 of a traffic channel, a paging channel, and a sync channel within CDMA system 100 in accordance with one embodiment of the present invention. It is appreciated that circuit 300 can be implemented in a variety of embodiments in accordance with the present invention. Moreover, it is appreciated that circuit 300 can be internally implemented within a mobile station (e.g., 104 of FIG. 1) of CDMA system 100. It should be further appreciated that circuit 300 is part of the metric address logic circuit 240 described above. It is further appreciated that the location of circuit 300 is not limited to its current location within the present embodiment. Generally, the present embodiment of circuit 300 is comprised of a multiplexer stage 302 coupled to a logic stage 314. One of the functions of logic stage 314 is to determine the identity of the channel (e.g., traffic, paging, or sync), stage (e.g., 0, 1, 2, etc.), and state (e.g., 0, 1, 2, etc.) corresponding to the state metric data 238 received by multiplexer stage 302. By determining this information, logic stage 314 is able to control multiplexer stage 302 to properly initialize state metric data for each of the traffic, paging, and sync channels. Furthermore, by determining the above information, logic stage 314 is also able to control multiplexer stage 302 in order to allow state metric data 238 pass through multiplexer stage 302 once a channel initialization process is complete.

Specifically, logic stage 314 within the present embodiment includes a logic gates circuit 308 which is coupled to receive the channel identification (ID) signal 244, stage identification (ID) signal 242, and modified state count signal 246, previously described above. Furthermore, logic gates circuit 308 is coupled to output signals which control the functionality of multiplexers (MUXs) 304 and 306 located within multiplexer stage 302. As such, the values of the channel ID signal 244, stage ID signal 242, and modified state count signal 246 subsequently control the functionality of MUXs 304 and 306 through logic gates circuit 308.

For example, when logic gates circuit 308 of FIG. 3 receives a channel ID signal 244 indicating the traffic channel, a stage ID signal 242 indicating stage zero (0), and a modified state count signal 246 indicating state zero (0), the logic gates circuit 308 output a low voltage signal (e.g., zero volts) over line 316 and a high voltage signal (e.g., 5 volts) over line 318. As such, the low voltage signal over line 316 causes MUX 304 to allow low value signal 310 (e.g., binary value of zero) to pass through to its output and be received by MUX 306. Additionally, the high voltage signal over line 318 causes MUX 306 to allow low value signal 310 received from MUX 304 to pass through to its output as state metric data 268. In this manner, the state zero metric of stage zero of the traffic channel is initialized to a zero value and received by the add-compare-select circuit 210 of FIG. 2. This would make state zero the most likely state from which the data is encoded initially, and this is the case for the traffic channel.

Continuing the above example, if logic gates circuit 308 then receives a modified state count signal 246 indicating state 1 while channel ID signal 244 and stage ID signal 242 remain the same, logic gates circuit 308 outputs a high voltage signal (e.g., 5 volts) over line 316 and a high voltage signal over line 318. As such, MUX 304 allows the high value signal 312 (e.g., binary value of 512) to pass through to its output and be received by MUX 306. Furthermore, MUX 306 allows high value signal 310 received from MUX 304 to pass through to its output as state metric data 268. In this manner, the state 1 metric of stage zero of the traffic at channel is initialized to a high value thereby avoiding choosing this state as the most likely one. This process for the state 1 metric is repeated for the remaining states (e.g., 2–7) of stage zero of the traffic channel thereby resulting in the initialization of metric data for the traffic channel. It should be appreciated that once stage ID signal 242 changes to indicate stage 1, logic gates circuit 308 outputs a low voltage signal over line 318 causing MUX 306 to allow state metric data signal 238 to pass through to its output as state metric data 268. It should be further appreciated that this process for stage 1 is repeated for all its states and also the remaining stages of the traffic channel. At this point of the process, it does not matter what value logic gates circuit 308 outputs over line 316.

Referring still to FIG. 3, circuit 300 operates in a different manner than described above when logic gates circuit 308 receives a channel ID signal 244 indicating either the paging channel or the sync channel. The reason for the difference in operation of circuit 300 is that the traffic channel is initialized differently than the paging channel and the sync channel, as mentioned above. Within the present embodiment, it should be appreciated that the paging channel is initialized in the same manner as the sync channel. As such, only an example of the paging channel is discussed in detail below.

Given that logic gates circuit 308 receives a channel ID signal 244 indicating the paging channel, a stage ID signal 242 indicating stage zero (0), and a modified state count signal 246 indicating state zero (0), the logic gates circuit 308 output a low voltage signal (e.g., zero volts) over line 316 and a high voltage signal (e.g., 5 volts) over line 318. As such, the low voltage signal over line 316 causes MUX 304 to allow low value signal 310 (e.g., binary value of zero) to pass through to its output and be received by an input of MUX 306. Additionally, the high voltage signal over line 318 causes MUX 306 to allow low value signal 310 received from MUX 304 to pass through to its output as state metric data 268. In this manner, the state zero metric of stage zero of the paging channel is initialized to a zero value and received by the add-compare-select circuit 210 of FIG. 2.

If logic gates circuit 308 of FIG. 3 then receives a modified state count signal 246 indicating state 1 while channel ID signal 244 and stage ID signal 242 remain the same, logic gates circuit 308 continues to output a low voltage signal over line 316 and a high voltage signal over line 318. As such, MUX 304 allows low value signal 310 to pass through to its output and be received by MUX 306. Furthermore, MUX 306 allows low value signal 310 received from MUX 304 to pass through to its output as state metric data 268. In this manner, the state 1 metric of stage zero of the paging channel is also initialized to a low value. This process for the state 1 metric is repeated for the remain states (e.g., 2–7) of stage zero of the paging channel. As a result, at the end of stage zero, all states are initialized to zero. This ensures that all states are treated as the most likely state from which the data is initially encoded and avoids any bias in favor of any one state. It is appreciated that this helps the decoding process, since for paging and sync channels, the convolutional encoder is not reset between frames. Hence, any state can most likely be the initial state for the convolutional encoder. It should be appreciated that once stage ID signal 242 changes to indicate stage 1, logic gates circuit 308 outputs a low voltage signal over line 318 causing MUX 306 to allow state metric data signal 238 to pass through to its output as state metric data 268. It should be further appreciated that this process for stage 1 is repeated for all its states and the remaining stages of the paging channel. At this point of the process, it does not matter what value logic gates circuit 308 outputs over line 316.

Figure 4:
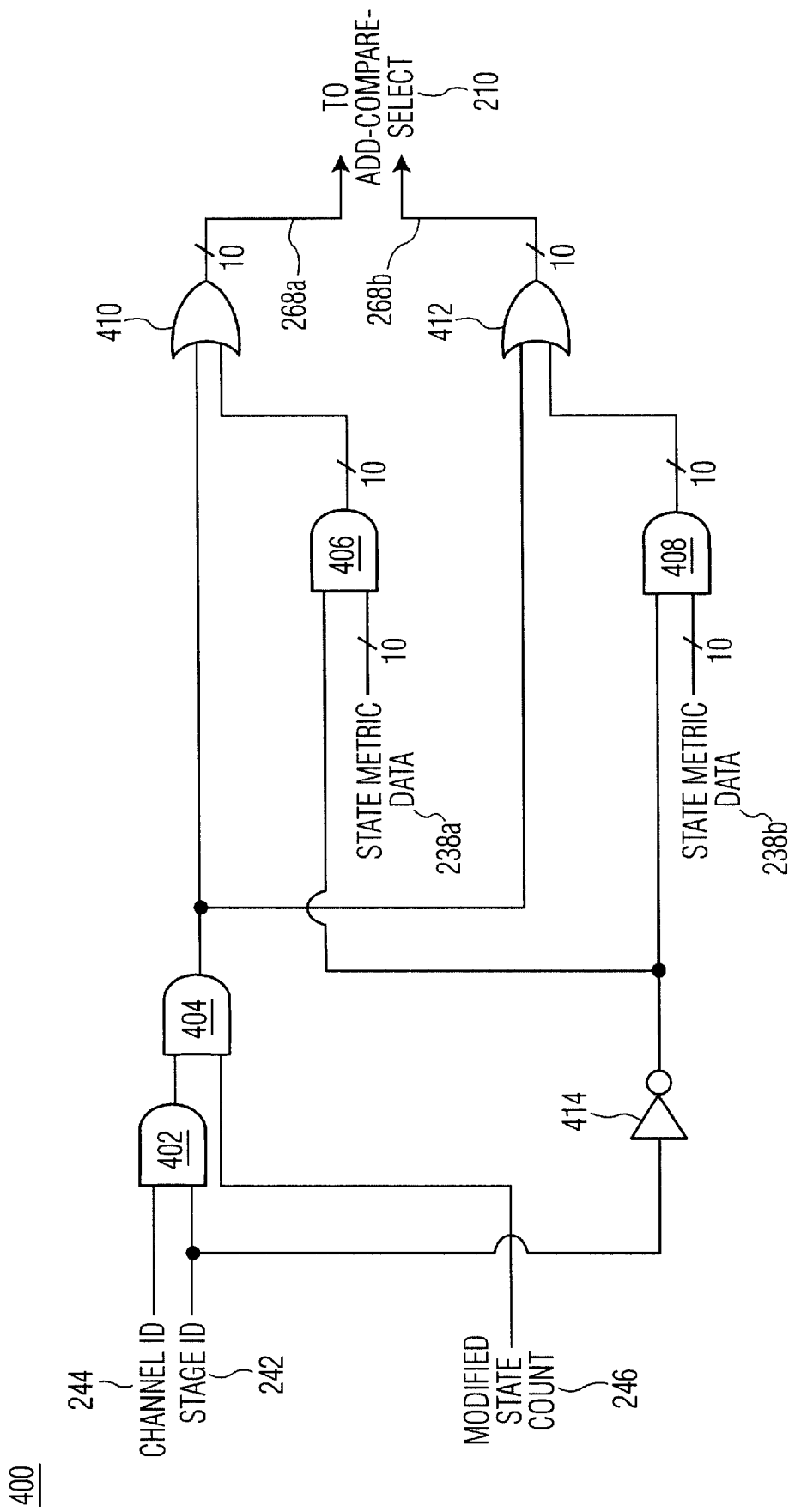
FIG. 4 is a schematic diagram of logic gates for implementing the circuitry of FIG. 3 in accordance with one embodiment of the present invention.

Now referring to FIG. 4, which is a specific schematic diagram of a logic gate circuit 400 for implementing circuit 300 of FIG. 3 in accordance with one embodiment of the present invention. It is appreciated that circuit 400 of FIG. 4 operates in the same manner and functionality as circuit 300, described above. Specifically, AND gate 402 is coupled to receive channel ID signal 244 and stage ID signal 242. The output of AND gate 402 is coupled to an input of AND gate 404 while the other input of AND gate 404 is coupled to receive modified state count signal 246. Invertor 414 is coupled to receive stage ID signal 242 and invert it. The output of invertor 414 is coupled to an input of AND gate 406 and an input of AND gate 408. It should be appreciated that state metric data 238 from metric memory 234 of FIG. 2 is received in two separate portions. As such, the other inputs of AND gate 406 are coupled to receive one portion of state metric data 238a while the other inputs of AND gate 408 are coupled to receive the other portion of state metric data 238b.

The output of AND gate 406 is coupled to an input of OR gate 410 while the output of AND gate 408 is coupled to an input of OR gate 412. Furthermore, an input of OR gate 410 and an input of OR gate 412 are both coupled to the output of AND gate 404. The outputs of OR gates 410 and 412 are coupled to the add-select-compare circuit 210 of FIG. 2. It is appreciated that OR gate 410 outputs state metric data 268a while OR gate 412 outputs state metric data 268b.

Figure 5:
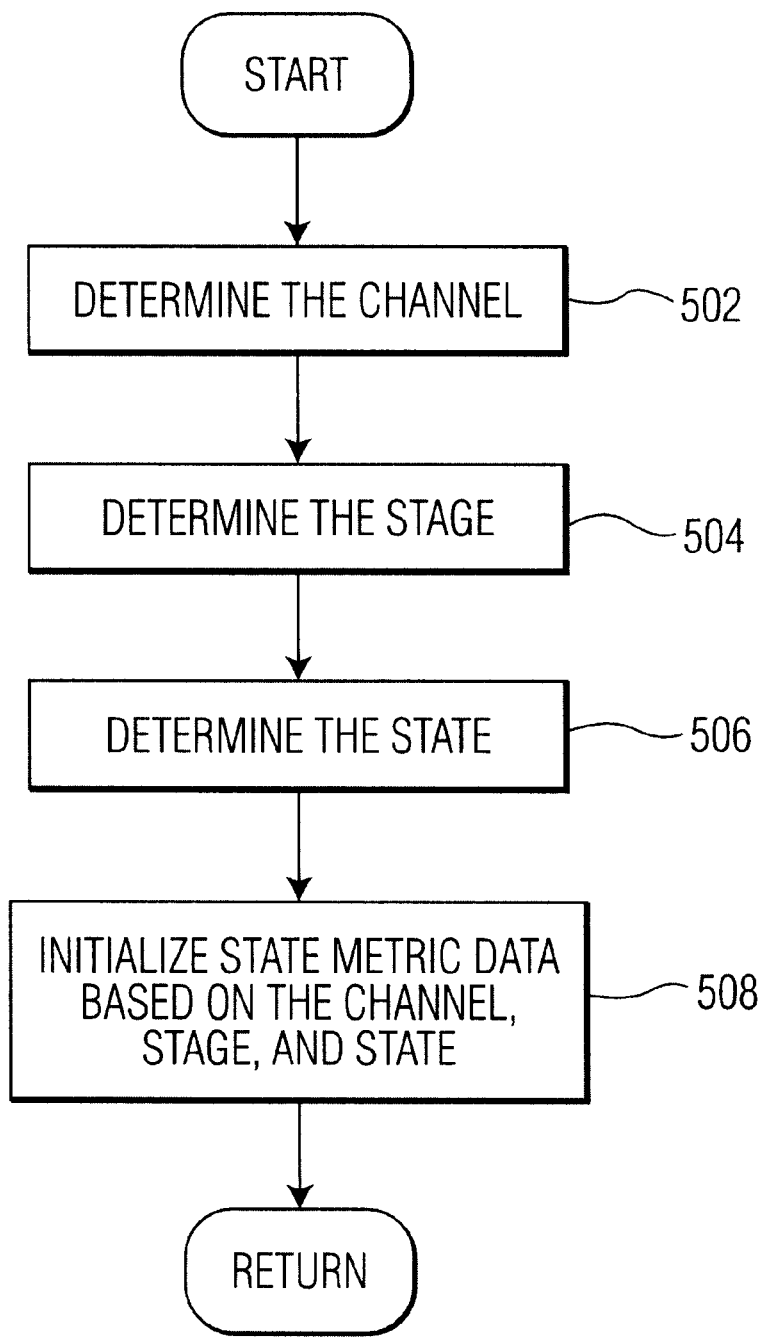
FIG. 5 is a flowchart of a method in accordance with one embodiment of the present invention.

With reference to FIG. 5, a flowchart 500 of steps performed in accordance with one embodiment of the present invention for initializing state metric data of a traffic channel, a paging channel, and a sync channel within CDMA system 100 without compromising performance of any channel. In other words, the present embodiment performs the initialization of any of the above listed channels efficiently. Flowchart 500 includes processes of the present invention which, in one embodiment, are carried out by electrical components under the control of computer readable and computer executable instructions. Although specific steps are disclosed in flowchart 500 of FIG. 5, such steps are exemplary. That is, the present invention is well suited to performing various other steps or variations of the steps recited in FIG. 5.

In step 502, within the present embodiment, a determination is performed by a Central Processing Unit (CPU) as to what channel state metric data corresponds to within a CDMA system.

At step 504, within the present embodiment, a determination is performed as to what stage the state metric data corresponds to within the Viterbi decoder trellis.

In step 506 of FIG. 5, within the present embodiment, a determination is performed as to what state the state metric data corresponds to within the Viterbi decoder trellis.

At step 508, within the present embodiment, an initialization of the state metric data is performed based on the channel, stage, and state corresponding to the state metric data within the CDMA system without compromising performance of a traffic channel, a paging channel, and a sync channel. It should be appreciated that the initialization process of state metric data of step 510 can be performed within a Viterbi decoder circuit in accordance with one embodiment of the present invention. Furthermore, the initialization process of state metric data of step 510 can also be performed within a handset of the CDMA system in accordance with one embodiment of the present invention.

Accordingly, the present invention provides a method and system for initializing state metric data of the traffic channel, paging channel, and sync channel within the Code Division Multiple Access (CDMA) system. Furthermore, the present invention efficiently performs these initialization processes by reducing the number of gates and hence power consumption. Moreover, the present invention does not utilize a large amount of space and also does not incur higher manufacturing expenses. Additionally, it enhances performance by quickly synchronizing to paging and sync frames.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A common circuit adapted for initializing state metric data of a traffic channel, a paging channel, and a sync channel within a Code Division Multiple Access (CDMA) system without compromising performance of any channel, said common circuit comprising:

a multiplexer stage coupled to receive a first signal and a second signal; and a logic stage coupled to receive a plurality of signals, said logic stage also coupled to said multiplexer stage, wherein said multiplexer stage and said logic stage are adapted to initialize state metric data of any one of a traffic channel, a paging channel, and a sync channel within a Code Division Multiple Access (CDMA) system such that said common circuit does not compromise performance of any one of said traffic channel, said paging channel, and said sync channel.

2. The common circuit as described in claim 1 wherein said common circuit is utilized with a Viterbi decoder circuit.

3. The common circuit as described in claim 1 wherein said common circuit is utilized with a mobile station of said Code Division Multiple Access (CDMA) system.

4. The common circuit as described in claim 1 wherein:
said first signal comprises a low value signal; and
said second signal comprises a high value signal.

5. The common circuit as described in claim 1 wherein said plurality of signals comprises:

a stage indication signal;

a channel indication signal; and a state indication signal.

6. The common circuit as described in claim 1 wherein said multiplexer stage and said logic stage are further adapted to initialize said traffic channel differently than said paging channel and said sync channel.

7. A common circuit adapted for initializing state metric data of a traffic channel, a paging channel, and a sync channel within a Code Division Multiple Access (CDMA) system without compromising performance of any channel, said common circuit comprising:

a multiplexer stage coupled to receive a low value signal and a high value signal; and a logic stage coupled to receive a plurality of signals, said logic stage also coupled to said multiplexer stage, wherein said multiplexer stage and said logic stage are adapted to initialize state metric data of any one of a traffic channel, a paging channel, and a sync channel within a Code Division Multiple Access (CDMA) system such that said common circuit does not compromise performance of any one of said traffic channel, said paging channel, and said sync channel.

8. The common circuit as described in claim 7 wherein said common circuit is utilized with a Viterbi decoder circuit.

9. The common circuit as described in claim 7 wherein said common circuit is utilized with a mobile station of said Code Division Multiple Access (CDMA) system.

10. The common circuit as described in claim 7 wherein said plurality of signals comprises:

a stage indication signal;

a channel indication signal; and a state indication signal.

11. The common circuit as described in claim 7 wherein said multiplexer stage and said logic stage are further adapted to initialize said paging channel and said sync channel differently that said traffic channel.

12. A method for initializing state metric data of a traffic channel, a paging channel, and a sync channel within a Code Division Multiple Access (CDMA) system without compromising initialization performance of any channel, said method comprising the steps of:

(a) determining what channel a state metric data corresponds to within a Code Division Multiple Access (CDMA) system;

(b) determining what stage said state metric data corresponds to;

(c) determining what state said state metric data corresponds to; and (d) initializing said state metric data based on said channel, said stage, and said state corresponding to said state metric data within said CDMA system without compromising performance of a traffic channel, a paging channel, and a sync channel.

13. The method for initializing state metric data of a traffic channel, a paging channel, and a sync channel within a CDMA system without compromising performance of any channel as described in claim 12 wherein said step (d) comprises:

initializing said state metric data based on said channel, said stage, and said state that said state metric data corresponds to within said CDMA system, wherein said state metric data is initialized within a Viterbi decoder circuit.

14. The method for initializing state metric data of a traffic channel, a paging channel, and a sync channel within a CDMA system without compromising performance of any channel as described in claim 12 wherein said step (d) comprises:

initializing said state metric data based on said channel, said stage, and said state that said state metric data corresponds to within said CDMA system, wherein said state metric data is initialized within a mobile station of said CDMA system.

15. A common circuit adapted for initializing state metric data of a first channel and a second channel within a communication system without compromising performance of any channel, said common circuit comprising:

a multiplexer stage coupled to receive a first signal and a second signal; and a logic stage coupled to receive a plurality of signals, said logic stage also coupled to said multiplexer stage, wherein said multiplexer stage and said logic stage are adapted to initialize state metric data of any one of a first channel and a second channel within a communication system such that said common circuit does not compromise performance of any one of said first channel and said second channel.

16. The common circuit as described in claim 15 wherein said multiplexer stage and said logic stage are further adapted to initialize said first channel differently than said second channel.

17. The common circuit as described in claim 15 wherein said common circuit is utilized with a Viterbi decoder circuit.

18. The common circuit as described in claim 15 wherein said common circuit is utilized with a mobile station of said communication system.

19. The common circuit as described in claim 15 wherein said common circuit is utilized with a base station of said communication system.

20. The common circuit as described in claim 15 wherein:
said first signal comprises a low value signal; and
said second signal comprises a high value signal.

21. The common circuit as described in claim 15 wherein said plurality of signals comprises:
a stage indication signal;
a channel indication signal; and
a state indication signal.

\* \* \* \* \*